United States Patent
Wu

(10) Patent No.: US 10,297,477 B2
(45) Date of Patent: May 21, 2019

(54) CHAMBER

(71) Applicant: BEIJING NAURA MICROELECTRONICS EQUIPMENT CO., LTD., Beijing (CN)

(72) Inventor: Xuewei Wu, Beijing (CN)

(73) Assignee: BEIJING NAURA MICROELECTRONICS EQUIPMENT CO., LTD. (CN)

( * ) Notice: Subject to any disclaimer, the term of this patent is extended or adjusted under 35 U.S.C. 154(b) by 38 days.

(21) Appl. No.: 15/109,281

(22) PCT Filed: Dec. 12, 2014

(86) PCT No.: PCT/CN2014/093705
§ 371 (c)(1),
(2) Date: Jun. 30, 2016

(87) PCT Pub. No.: WO2015/101159
PCT Pub. Date: Jul. 9, 2015

(65) Prior Publication Data
US 2016/0322243 A1 Nov. 3, 2016

(30) Foreign Application Priority Data
Dec. 31, 2013 (CN) .......................... 2013 1 0749675

(51) Int. Cl.
*H01L 21/67* (2006.01)
*B08B 7/00* (2006.01)

(52) U.S. Cl.
CPC ...... *H01L 21/67109* (2013.01); *B08B 7/0071* (2013.01); *H01L 21/6719* (2013.01); *H01L 21/67126* (2013.01)

(58) Field of Classification Search
CPC ......... H01L 21/67109; H01L 21/67126; H01L 21/6719; H01L 21/67098; H01L 21/67103;
(Continued)

(56) References Cited

U.S. PATENT DOCUMENTS

| 2004/0221957 A1 | 11/2004 | Ludviksson |
| 2005/0145341 A1* | 7/2005 | Suzuki ................. H01J 37/321 156/345.49 |

(Continued)

FOREIGN PATENT DOCUMENTS

CN 102598210 A 7/2012

OTHER PUBLICATIONS

PCT/CN2014/093705 International Search Report dated Mar. 4, 2015; 2 pgs.

*Primary Examiner* — David G Cormier
(74) *Attorney, Agent, or Firm* — Bracewell LLP; Brad Y. Chin

(57) ABSTRACT

Embodiments of the invention provide a chamber for semiconductor processing, which includes a chamber body and an isolation window, the chamber body being of a tubby structure and having an upper end which is an open end, and the isolation window being arranged at the open end of the chamber body and used for sealing the chamber. The chamber further includes an isolation window fixing structure used for fixing the isolation window at the open end of the chamber body and a first fixing part and a second fixing part connected with each other, the first fixing part being fixedly connected with an edge area of an upper surface of the isolation window, and the second fixing part being fixedly connected with the chamber body.

10 Claims, 4 Drawing Sheets

(58) Field of Classification Search
CPC ............. H01L 21/67115; B08B 7/0071; B08B 2203/0211; B01J 3/004; G02B 7/007
See application file for complete search history.

(56) References Cited

U.S. PATENT DOCUMENTS

2005/0268567 A1* 12/2005 Devine ............. H01L 21/67115
  52/204.5
2005/0274396 A1  12/2005 Shih et al.
2011/0097900 A1*  4/2011 Augustino ........ H01J 37/32467
  438/710

* cited by examiner

CHAMBER

CROSS REFERENCE TO RELATED APPLICATION

This application claims the benefit of and priority to PCT/CN2014/093705 filed on Dec. 12, 2014, entitled (translation), "CHAMBER," which claims the benefit of and priority to Chinese Patent Application No. 201310749675.1 filed on Dec. 31, 2013, of which is entitled (translation), "CHAMBER," and which is hereby incorporated by reference in its entirety into this application.

BACKGROUND

Field of the Invention

Embodiments of the invention relate to the manufacturing field of a semiconductor apparatus, and more particularly, to a chamber.

Description of the Related Art in the process of semiconductor manufacturing, a degas chamber is used for heating a wafer, such that foreign matters adhering to the wafer, such as organics and moisture, are volatilized, and the purpose of cleaning the wafer is thus realized.

Typically, a current structure of a degas chamber is as shown in FIGS. 1 and 2, in which a quartz window 3 is provided between a chamber 1 and infrared heat lamps 2 for the purpose of isolation and ensuring the tightness of the chamber 1. A resin pad 4 is provided above a. side wall 6 of the chamber 1, and the resin pad 4 and the side wall 6 of the chamber 1 together form a recess for accommodating the quartz window 3. The recess is not only used for restricting the movement of the quartz window 3 in a horizontal direction, but also used for supporting the quartz window 3. Generally, the inside of the chamber 1 is under a vacuum condition, and gas is introduced into the chamber 1 after a wafer is transferred from the outside of the chamber onto a heater 5, such that the pressure in the chamber 1 is about 10 torr. After that, the wafer is heated so as to remove foreign matters, and when the heating is finished, the gas in the chamber 1 is evacuated, resulting in that the inside of the chamber 1 is under the vacuum condition again.

During above gas introduction and evacuation processes, the quartz window 3 repeatedly bears an alternating pressure due to the variation in pressure inside the chamber 1. Since the quartz window 3 of the above current structure is not fixed in a vertical direction, but only supported by the resin pad 4, the quartz window 3 may move in the vertical direction under the action of the alternating pressure. Particularly, during the evacuation process, due to the atmospheric pressure above the chamber, the quartz window 3 bears a relatively large downward pressure, which is then transferred to the resin pad 4, and the resin pad 4 deforms when subject to the downward pressure transferred from the quartz window 3, resulting in that the quartz window 3 moves downward. The deformation of the resin pad 4 being pressed is relatively large due to its relatively low hardness, generally resulting in that an upper surface thereof becomes not higher than an upper surface of the side wall 6 of the chamber 1 at the inner side of the resin pad 4, and in this case, a collision occurs between the quartz window 3 and the side wall 6 of the chamber 1, which leads to a breakage of the quartz window 3. Meanwhile, during the heating process, a temperature of the quartz window 3 is increased and heat is conducted to the resin pad 4, which may soften and deform the resin pad 4, so that the quartz window 3 will be subject to an uneven force, by which the quartz window 3 is more likely to be broken.

To prevent the quartz window from colliding with the chamber and thus being broken, there is also provided a degas chamber in the conventional art, which has a quartz window fixing device. As shown in FIG. 3, on basis of the above structure of degas chamber, this degas chamber further includes a fixing device including a quartz window press ring 8, a press ring bumper 9 and a resin pad 4. The quartz window press ring 8 is fixedly mounted on the side wall 6 of the chamber, and the mounted quartz window press ring 8 is pressed against an upper surface of the quartz window 3 so as to apply a preload onto the quartz window 3. The press ring bumper 9 is directly placed on the quartz window 3 and is fixed by the preload from the quartz window press ring 8. The degas chamber having the quartz window fixing device is capable of confining the moving space of the quartz window 3 in the vertical direction to a certain extent when the pressure in the chamber varies, and thus preventing the quartz window 3 from frequently colliding with the chamber in the manufacturing process, thereby realizing a protection effect for the quartz window 3.

The above degas Chamber having the quartz window fixing device is capable of reducing the moving space of the quartz window to a certain extent and thus lowering the force of collision between the quartz window and the chamber, but, since the quartz window is still supported by the resin pad, the resin pad is inevitably deformed due to the pressure in the repeated gas introduction and evacuation processes, and is inevitably deformed due to the heat in the heating process, and therefore, the damage to the quartz window caused by the side wall of the chamber cannot be fundamentally avoided.

SUMMARY

In view of the above, embodiments of the invention provide a chamber for solving the problem of damage to the isolation window, which is caused by collision of the isolation window when the isolation window moves in a vertical direction due to deformation of a resin pad subject to pressure or temperature variation.

According to at least one embodiment, there is provided a chamber for semiconductor processing, which includes a chamber body and an isolation window. The chamber body includes a tubby structure and has an upper end which is an open end, and the isolation window is arranged at the open end of the chamber body and used for sealing the chamber. The chamber further includes an isolation window fixing structure used for fixing the isolation window at the open end of the chamber body and a first fixing part and a second fixing part connected with each other. The first fixing part is fixedly connected with an edge area of an upper surface of the isolation window, and the second fixing part is fixedly connected with the chamber body.

According to at least one embodiment, a lower surface of the first fixing part and a lower surface of the second fixing part are located in two horizontal planes.

According to at least one embodiment, lower surfaces of the first and second fixing parts are located in a same horizontal plane.

According to at least one embodiment, the isolation window fixing structure further includes a washer and a first fastener, wherein the edge area of the upper surface of the isolation window is arranged therein with a through hole, the lower surface of the first fixing part includes a first mounting hole, the washer is arranged therein with a second mounting hole, and the first fastener passes through the second mounting hole and the through hole in the isolation window successively from bottom to top and is fixed into the first mounting hole, so as to fixedly connect the washer and the isolation window with the first fixing part.

According to at least one embodiment, the washer is made of a copper material.

According to at least one embodiment, the isolation window fixing structure further includes a buffering element, which is arranged between the washer and the isolation window.

According to at least one embodiment, the first and second fixing pans are made of a metal material.

According to at least one embodiment, at least one of the first fixing part and the second. fixing part is arranged therein with a cooling water channel for introducing cooling water.

According to at least one embodiment, a first sealing element is arranged between the lower surface of the first fixing part and the upper surface of the isolation window According to at least one embodiment, a second sealing, element is arranged between the lower surface of the second fixing part and an upper surface of a side wall of the chamber body.

According to at least one embodiment, the chamber is a degas chamber or a reaction chamber.

BRIEF DESCRIPTION OF THE DRAWINGS

These and other features, aspects, and advantages of the invention are better understood with regard to the following Detailed Description, appended Claims, and accompanying Figures. It is to be noted, however, that the Figures illustrate only various embodiments of the invention and are therefore not to be considered limiting of the invention's scope as it may include other effective embodiments as well.

DETAILED DESCRIPTION

Figure 1:
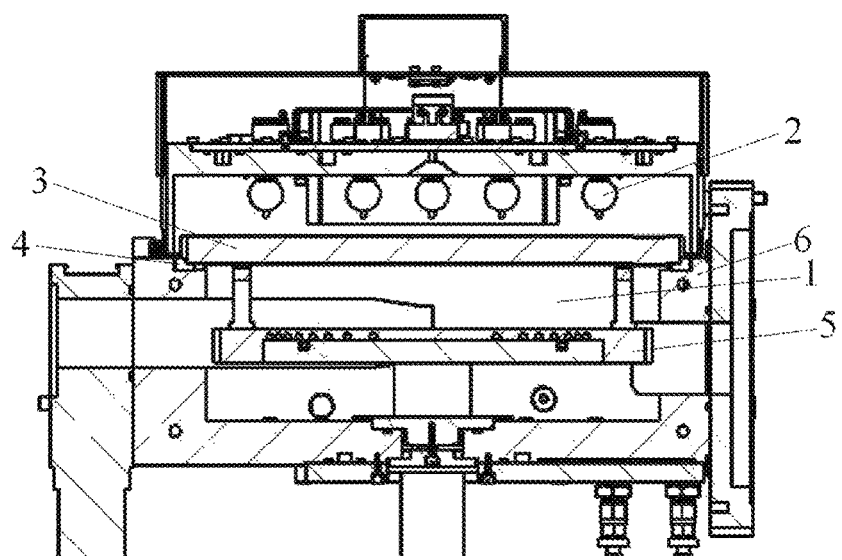
FIG. 1 is an exemplary diagram of a structure of a conventional chamber.
Figure 2:
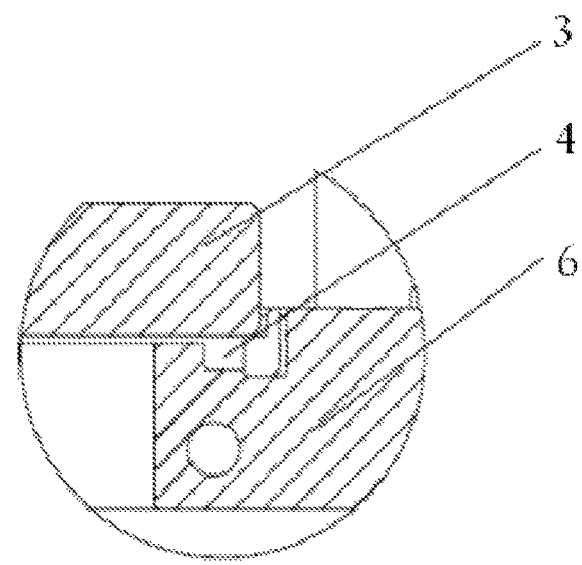
FIG. 2 is an exemplary partial view of a portion in FIG. 1.
Figure 3:
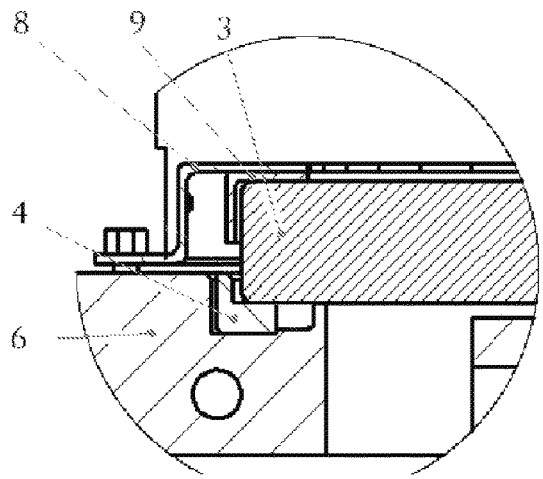
FIG. 3 is an exemplary partial view of a conventional degas chamber having a quartz window fixing device.
Figure 4:
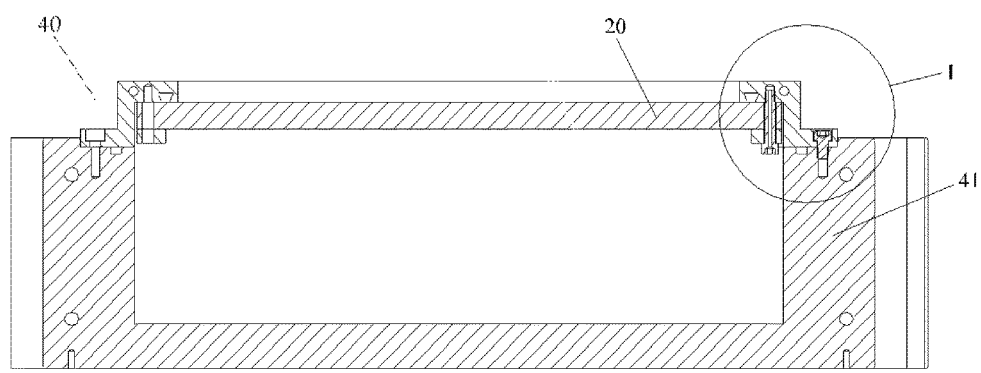
FIG. 4 is an exemplary partial view of a structure of a chamber according to an embodiment of the invention.
Figure 5:
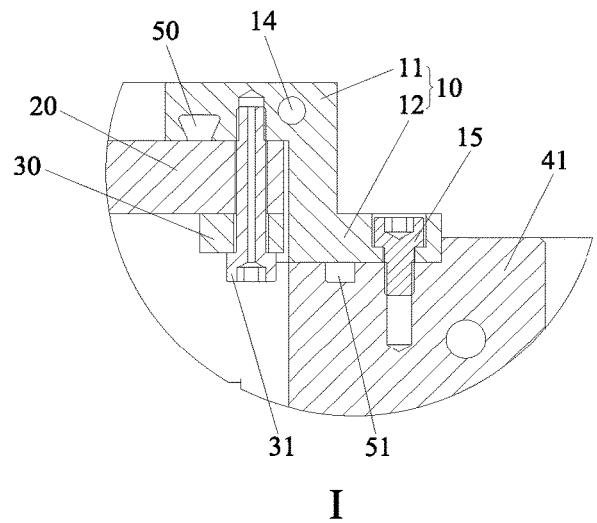
FIG. 5 is an exemplary partial view of a portion I in FIG. 4 according to an embodiment of the invention.

Advantages and features of the invention and methods of accomplishing the same will be apparent by referring to embodiments described below in detail in connection with the accompanying drawings. However, the invention is not limited to the embodiments disclosed below and may be implemented in various different forms. The embodiments are provided only for completing the disclosure of the invention and for fully representing the scope of the invention to those skilled in the art.

For simplicity and clarity of illustration, the drawing figures illustrate the general manner of construction, and descriptions and details of well-known features and techniques may he omitted to avoid unnecessarily obscuring the discussion of the described embodiments of the invention. Additionally, elements in the drawing figures are not necessarily drawn to scale. According to at least one embodiment, the dimensions of some of the elements in the figures may be exaggerated relative to other elements to help improve understanding of embodiments of the invention. Like reference numerals refer to like elements throughout the specification.

Referring to FIGS. 4-8, an embodiment of the invention provides a chamber 40, including a chamber body 41, an isolation window 20, and an isolation window fixing structure 10. The chamber body 41 has a tubby structure and an upper end thereof is an open end. The isolation window 20 is arranged at the open end of the chamber body 41 and used for sealing the chamber 40. The isolation window fixing structure 10 is used for fixing the isolation window 20 at the open end of the chamber body 41 and includes a first fixing part 11 and a second fixing part 22 connected with each other. The first fixing part 11 may be fixedly connected with an edge area of an upper surface of the isolation window 20, and the second fixing part 12 may he fixedly connected with the chamber body 41.

According to at least one embodiment, the isolation window fixing structure 10 may be arranged to surround the isolation window 20, and a shape of the isolation window fixing structure 10 may correspond to a shape of the isolation window 20 so as to be arranged to surround the isolation window 20. For example, the isolation window 20 may be a circular quartz window, and the isolation window fixing structure 10 may be processed to have a ring shape corresponding thereto. The isolation window fixing structure 10 includes the first fixing part 11 and the second fixing part 12 arranged at outer edge of the first fixing part 11, wherein the Outer edge of the first fixing part 11 refers to an edge area of the first fixing part 11 at a side thereof that is far away from a center of the isolation window fixing structure 10. Specifically, the first fixing part 11 is arranged above the isolation window 20, and a first fastener 31 may be used to fixedly connect the first fixing part 11 with the isolation window 20. The second fixing part 12 is arranged on a side wall of the chamber body and fixedly connected with the side wall of the chamber body through a second fastener 15. The isolation window 20 can be fixedly arranged above the chamber body 41 by virtue of the isolation window fixing structure 10.

With the above, structure replacing the recess formed of the resin pad and the side wall of the chamber in the conventional art, the isolation window 20 is firmly fixed on the chamber body 41, so that displacement of the isolation window 20 in the vertical direction and horizontal direction is confined, and the problem of the isolation window 20 being damaged by collision with the side wall of the chamber body 41 due to the displacement thereof is avoided. When the pressure inside the chamber 40 is decreased, a downward pressure will be applied onto the isolation window 20, but, since the isolation window fixing structure 10 firmly fixes the isolation window 20 onto the chamber body 41, and thus confines the position of the isolation window 20, the possibility of the isolation window 20 being displaced and colliding with the chamber body 41 is fundamentally avoided. Meanwhile, since the resin pad is not adopted, the problem that the isolation window 20 is easily damaged by uneven force applied thereto due to the deformation of the heated resin pad in the prior art can be avoided.

Figure 6:
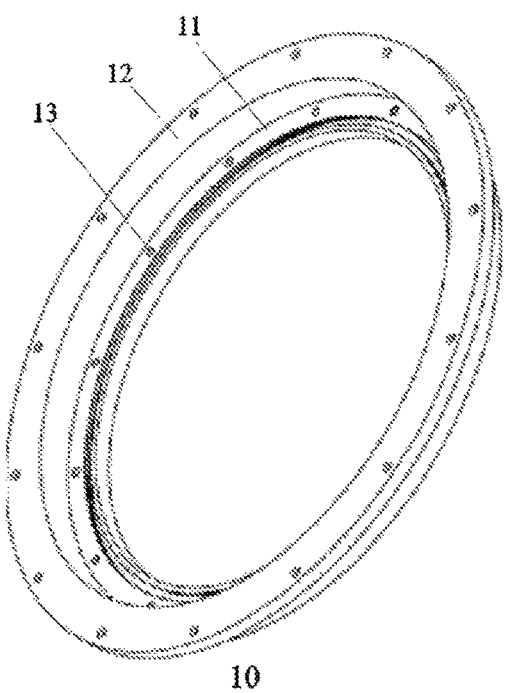
FIG. 6 is an exemplary diagram of a fixing member according to an embodiment of the invention.

Further, according to the chamber provided by an embodiment, a lower surface of the first fixing part 11 and a lower surface of the second fixing part 12 are located in two horizontal planes, thus, the first fixing part 11 and the second fixing part 12 are arranged in a step manner, and the lower surface of the second fixing part 12 is arranged under am outer edge of the lower surface of the first fixing part 11, as shown in FIG. 6.

Figure 7:
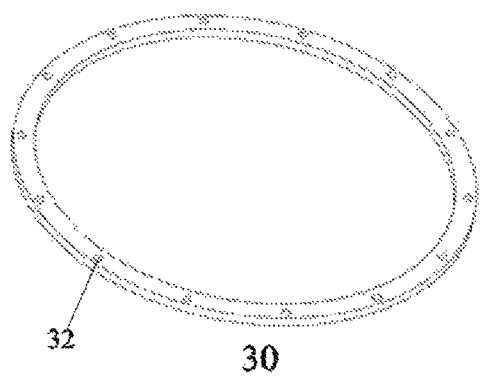
FIG. 7 is an exemplary diagram of a washer according to an embodiment of the invention.
Figure 8:
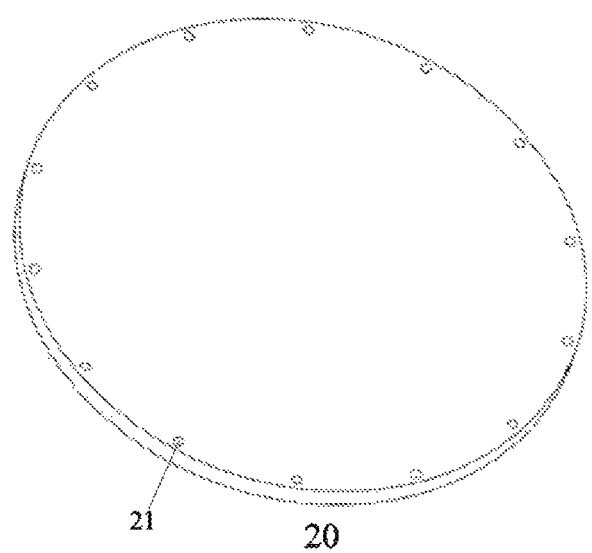
FIG. 8 is an exemplary diagram of an isolation window according to an embodiment of the invention.

According to at least one embodiment, the chamber according to an embodiment of the invention may also include a washer 30, and the lower surface of the first fixing part 11 is arranged therein with a first mounting hole 13, as shown in FIG. 6. A second mounting hole 32 is arranged in the washer 30, as shown in FIG. 7. The washer 30 may be arranged at the lower surface of the isolation window 20. The first fastener 31 is used for being mounted in the first mounting hole 13 after passing through the second mounting hole 32 and a through hole preset in the isolation window 20 as shown in FIG. 8. As such, the washer 30, the isolation window 20 and the first fixing part 11 can be fixedly connected through the first fastener 31. Preferably, there is a plurality of through holes 21, which are uniformly arranged along the circumferential direction of the isolation window 20. In this case, the numbers and positions of the washers 30, the first fasteners 31 and the first mounting holes 13 correspond to the number and position of the through holes 21 in the isolation window 20 one by one, so as to improve uniformity of force applied onto the isolation window fixing structure 10.

In this case, the vacuum force applied onto the isolation window 20 and the tensile force generated from the first fastener 31 are balanced. Specifically, the number of the first fasteners 31 can be set based on the weight of the isolation window 20, the pressure applied onto the isolation window 20, the area of the isolation window 20 and how much force each first fastener 31 can bear.

With the above structure, the isolation window 20 can be arranged under the first fixing part 11 and is fixedly connected with the first fixing part 11 through the first fastener 31, wherein the first fastener 31 may be a screw and the first mounting hole 13 may be a screwed hole. Since the isolation window 20 is generally made of quartz material and a lower fixing end of the first fastener 31 has a small area, the isolation window 20 may be damaged if the first fastener 31 is directly brought into contact with the isolation window 20. For this reason, the washer 30 may be arranged at the lower surface of the isolation window 20 so as to increase the area of action force applied onto the isolation window 20 from the first fastener 31, and to huller the action force between the first fastener 31 and the isolation window 20, thereby preventing the isolation window 20 from being damaged.

According to at least one embodiment, the washer 30 may be Made of a copper material. Preferably, red copper may be processed to form the washer 30. Since the hardness of the red copper is relatively small, the action force between the isolation window 20 and the first fastener 31 can be effectively buffered by the washer. Particularly, in the evacuation process, the isolation window 20 is subject to an atmospheric pressure above the chamber 40 and presses downwardly, and the washer 30 can effectively prevent the isolation window 20 from pressing the first fastener 31 downwardly and being damaged.

According to at least one embodiment, the first fixing part 11 and the second fixing part 12 may be formed integrally, but the present invention is riot limited thereto. In practical applications, the first fixing part 11 and the second fixing part 12 may be formed as two parts separated from each other, and can be rigidly connected through a fastener such as a screw When used, as long as it is ensured that when any one of the first fixing part 11 and the second fixing part 12 is displaced or subject to a three, the other one connected thereto is not displaced or deformed relatively.

According to at least one embodiment, the chamber according to an embodiment of the invention may also include a buffering element, which may be arranged between the washer 30 and the isolation window 20. That is, a buffering element made of a soft material may be separately arranged between the isolation window 20 and the washer 30 to buffer the action force between the washer 30 and the isolation window 20.

According to at least one embodiment, the isolation window fixing structure 10 may be made of a metal material. It helps to firmly fix the isolation window 20 when the isolation window fixing structure 10 is made of a metal material. Meanwhile, the heat from the isolation window 20 can be dissipated by virtue of the isolation window fixing structure 10 that is made of a metal material, so that heat dissipation of the isolation window 20 is facilitated. Preferably, aluminum or copper may be selected to manufacture the isolation window fixing structure 10.

According to at least one embodiment, a first sealing element 50, such as a sealing ring, may be arranged between the lower surface of the first fixing part 11 and the upper surface of the isolation window 20, so as to ensure the tightness of the chamber 40. The isolation window 20 may press downwardly due to the atmospheric pressure above the chamber 40, and the above structure in which the first sealing element 50 is arranged on the upper surface of the isolation window 20 can avoid the situation in which the isolation window 20 excessively presses the first sealing element 50, and leads to deformation and/or damage of the first sealing element 50, resulting in movement of the isolation window 20 in the vertical direction.

According to at least one embodiment, a second scaling element 51, such as a sealing ring, may be arranged between the lower surface of the second fixing part 12 and the upper surface of the side wall of the chamber body, so as to further ensure the tightness of the chamber 40.

According to at least one embodiment, the isolation window fixing structure 10 may be provided with a cooling water channel 14 therein, which may be used to introduce cooling water. The arrangement of the cooling water channel 14 can make the heat taken away by the cooling water in the cooling water channel 14 after the heat is transferred from the isolation window 20 to the isolation window fixing structure 10, so that the heat dissipation of the isolation window 20 is facilitated, and the isolation window 20 is under protection. Meanwhile, the damage to the first sealing element 50 between the first fixing part 11 and the isolation window 20, due to an increase in temperature of the isolation window 20, can be avoided. Preferably, the cooling water channel 14 is arranged in a portion of the isolation window fixing structure 10 close to the isolation window 20, for example, on the first fixing part 11.

The chamber according to various embodiments of the invention have been described above, and it can be seen that by providing the isolation window fixing structure 10, in which the first fixing part 11 is fixedly connected with the edge area of the upper surface of the isolation window 20 and the second fixing part 12 is fixedly connected with the chamber body 41, the isolation window 20 can be firmly fixed to the chamber body 41, so that the displacements of the isolation window 20 in the vertical and horizontal directions are confined, and the problem of damage to the isolation window 20 caused by its collision with the chamber body 41 due to the displacements of the isolation window 20 can be avoided. Meanwhile, the isolation window 20 can be supported and fixed by the isolation window fixing structure 10 without the conventional resin pad, so that the problem that the isolation window is likely to be damaged by uneven force applied thereto due to the deformation of the heated resin pad can be avoided.

Figure 9:
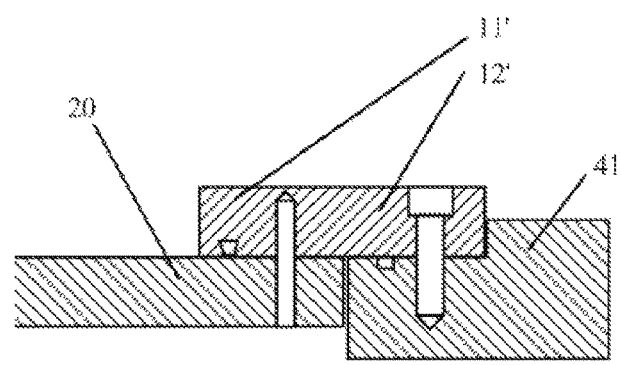
FIG. 9 is an exemplary partial view of a structure of a chamber according to embodiment of the invention.

As a chamber according to various embodiments of the invention, it also includes a first fastener 31, a first mounting hole 13, a second fastener 15, a second mounting hole 32, a washer 30, a cooling water channel 14 and a buffering element, as shown in FIG. 9. Since structural relationships among the above components and their functions have been described in detail in the first embodiment, they will not be described herein. The difference between the present embodiment and the first embodiment as above lies in that a first fixing part 11' and a second fixing part 12' are not arranged in a step manner. Specifically, in the present embodiment, an upper surface of the first fixing part 11' and an upper surface of the second fixing part 12' are located in a same plane, and the a lower surface of the first fixing part 11' and a lower surface of the second fixing part 12' are located in a same plane. That is to say, the first fixing part 11' and the second fixing part 12' are provided in a same horizontal plane.

It needs to be noted that, in actual applications, the lower surface of the first fixing part may be arranged to be lower than the lower surface of the second fixing part according to actual needs. That is, the upper surface of the isolation window is made lower than the upper surface of the side wall of the chamber body.

It also needs to be noted that, the chamber provided by embodiments of the present invention may be a degas chamber, a reaction chamber or the like in the field of semiconductor processing technology. The chamber provided by various embodiments of the invention is applicable for these chambers as long as they have an isolation window and involve the gas introduction process and the evacuation process.

Terms used herein are provided to explain embodiments, not limiting the invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Embodiments of the invention may suitably comprise, consist or consist essentially of the elements disclosed and may be practiced in the absence of an element not disclosed, According to at least one embodiment, it can be recognized by those skilled in the art that certain steps can be combined into a single step.

The terms and words used in the specification and claims should not be interpreted as being limited to typical meanings or dictionary definitions, but should be interpreted as having meanings and concepts relevant to the technical scope of the invention based on the rule according to which an inventor can appropriately define the concept of the term to describe the best method he or she knows for carrying out the invention.

The terms "first," "second," "third," "fourth," and the like in the description and in the claims, if any, are used for distinguishing between similar elements and not necessarily for describing a particular sequential or chronological order. It is to he understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The singular forms "a," "an," and "the" include plural referents, unless the context clearly dictates otherwise.

As used herein and in the appended claims, the words "comprise," "has," and "include" and all grammatical variations thereof are each intended to have an open, non-limiting meaning that does not exclude additional elements or steps.

As used herein, t will be understood that unless a term such as 'directly' is not used in a connection, coupling, or disposition relationship between one component and another component, one component may be 'directly connected to', 'directly coupled to' or 'directly disposed to' another element or be connected to, coupled to, or disposed to another element, having the other element intervening therebetween.

As used herein, the terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to each other may be in physical contact with each other, in close proximity to each other, or in the same general region or area as each other, as appropriate for the context in which the phrase is used. Occurrences of the phrase "according to an embodiment" herein do not necessarily all refer to the same embodiment.

It also could be understood that the foregoing implementations are merely exemplary implementations used for the purpose of explaining the principle of the embodiments of the invention, but the invention is not limited thereto. Many variations and improvements can be made by those of ordinary skill in the art without departing from the spirit and essence of the embodiments of the invention. These variations and improvements are also regarded as the protection scope of the embodiments of the invention.

The invention claimed is:

1. A chamber for semiconductor processing, comprising:
a chamber body; and
an isolation window,
wherein the chamber body includes a tubby structure and comprises an upper end which is an open end,
wherein the isolation window is arranged at the open end of the chamber body and used for sealing the chamber, and
wherein the chamber further comprises an isolation window fixing structure configured to fix the isolation window at the open end of the chamber body, and a first fixing part and a second fixing part connected with each other, the first fixing part being fixedly connected with an edge area of an upper surface of the isolation window, and the second fixing part being fixedly connected with the chamber body, wherein the isolation window fixing structure further comprises a washer and a first fastener, the edge area of the upper surface of the isolation window is provided therein with a through hole, a lower surface of the first fixing part is provided with a first mounting hole, the washer is provided therein with a second mounting hole, and the first fastener is configured to pass through the second mounting hole and through hole in the isolation window successively from bottom to top and is fixed into the first mounting hole, so as to fixedly connect the washer and the isolation window with the first fixing part.

2. The chamber according to claim 1, wherein the lower surface of the first fixing part and a lower surface of the second fixing part are located in two horizontal planes.

3. The chamber according to claim 1, wherein the lower surface of the first fixing part and a lower surface of the second fixing part are located in a same horizontal plane.

4. The chamber according to claim 1, wherein the washer is made of a copper material.

5. The chamber according to claim 1, wherein the isolation window fixing structure further comprises a buffering element arranged between the washer and the isolation window.

6. The chamber according to claim 1, wherein the first and second fixing parts are made of a metal material.

7. The chamber according to claim 1, wherein at least one of the first fixing part and the second fixing part is arranged therein with a cooling water channel configured to introduce cooling water.

8. The chamber according to claim 1, wherein a first sealing element is arranged between the lower surface of the first fixing part and the upper surface of the isolation window.

9. The chamber according to claim 1, wherein a second sealing element is arranged between a lower surface of the second fixing part and an upper surface of a side wall of the chamber body.

10. The chamber according to claim 1, wherein the chamber is a degas chamber or a reaction chamber.

* * * * *